(12) United States Patent
Micovic

(10) Patent No.: US 7,749,863 B1
(45) Date of Patent: Jul. 6, 2010

(54) THERMAL MANAGEMENT SUBSTRATES

(75) Inventor: Miro Micovic, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/128,593

(22) Filed: May 12, 2005

(51) Int. Cl.
    *H01L 21/30* (2006.01)
(52) U.S. Cl. ............................. 438/459; 257/E21.122; 257/E21.568
(58) Field of Classification Search ................. 438/459; 257/E21.122, E21.568
    See application file for complete search history.

(56) References Cited

U.S. PATENT DOCUMENTS

| 5,561,303 | A | * | 10/1996 | Schrantz et al. ............... 257/77 |
| 6,020,458 | A | * | 2/2000 | Lee et al. ..................... 528/401 |
| 2002/0022344 | A1 | * | 2/2002 | Kang et al. .................. 438/459 |
| 2002/0096717 | A1 | * | 7/2002 | Chu et al. .................... 257/347 |
| 2002/0190319 | A1 | * | 12/2002 | Borenstein .................. 257/347 |
| 2005/0164482 | A1 | * | 7/2005 | Saxler ......................... 438/604 |

OTHER PUBLICATIONS

M. Bruel, "Silicon on Insulator Material Technology," Electronics Letters vol. 31, pp. 1201-1202, 1995.

* cited by examiner

*Primary Examiner*—Jarrett J Stark
(74) *Attorney, Agent, or Firm*—Tope-McKay & Assoc.

(57) ABSTRACT

A method for fabricating a thermal management substrate comprises acts of ion-implanting a substrate material to form a substrate layer, a ion-implanted layer, and an overlay layer; bonding a handle wafer to the overlay layer with a $SiO_2$ bonding layer; splitting the ion-implanted wafer at the ion-implanted layer, resulting in a handle wafer $SiO_2$ bonded with the overlay layer; depositing an insulating layer onto the overlay layer; and removing the handle wafer, whereby the resulting thermal management substrate comprises an overlay layer epitaxially fused with the insulating layer.

38 Claims, 2 Drawing Sheets

THERMAL MANAGEMENT SUBSTRATES

BACKGROUND OF INVENTION

(1) Field of Invention

The present invention relates to a process used for fabrication of SiC and AlN on diamond or diamond-like carbon (DLC) wafers, and more particularly, SiC and AlN on wafers that can be used as substrates for deposition of GaN Heterojunction Field Effect Transistors (HFETs).

(2) Discussion of Related Art

All systems that use high-power microwave and millimeter-wave power sources utilize GaN Heterojunction Field Effect Transistors (HFETs). The power performance of GaN HFETs are currently limited by the thermal management of the device. The efficiency with which heat is dissipated from the device is ultimately limited by the thermal conductance of a substrate material. SiC, currently the substrate material of choice for deposition of GaN HFET epi-layers, is an excellent thermal conductor. However, the thermal conductance of SiC (i.e., 4.5 W/mm) is still substantially lower than that of the best known thermal conductor, diamond. AlN, which is another substrate suitable for deposition of GaN HFETs, has an even poorer thermal conductance (i.e., 3.3 W/mm) than SiC.

From the standpoint of thermal management, diamond would be an ideal substrate for fabrication of high power GaN HFETs, as it would provide higher output power densities than current devices fabricated on SiC. The current technique for deposition of large diameter diamond films, Plasma Enhanced Chemical Vapor Deposition (PECVD), produces only polycrystalline diamond films. However, polycrystalline diamond films alone are not suitable for deposition of single-crystal films that are required for fabrication of electron devices.

Thus, a continuing need exists for a fabrication process that forms a diamond, or diamond-like substrate for fabrication of high power GaN HFETs.

SUMMARY OF INVENTION

The present invention relates to a method for fabrication of a thermal management substrate. The method comprises acts of: selecting a substrate material; ion-implanting the substrate material to form a substrate layer, a ion-implanted layer, and an overlay layer, the substrate layer being comprised of the substrate material, and the three layers collectively being a ion-implanted substrate wafer; bonding a handle wafer to the overlay layer with a $SiO_2$ bonding layer; splitting the ion-implanted substrate wafer at the ion-implanted layer, resulting in a handle wafer $SiO_2$ bonded with the overlay layer; depositing a thermally conductive electrically insulating layer onto the overlay layer, resulting in a composite structure; and removing the handle wafer, resulting in a thermal management substrate that comprises an overlay layer epitaxially fused with the insulating layer.

In another aspect, the method further comprises an act of polishing the insulating layer to improve flatness and surface finish.

In yet another aspect, the method further comprises an act of removing the $SiO_2$ bonding layer from the overlay layer.

Additionally, the method further comprises an act of polishing the overlay layer.

Furthermore, in the act of selecting the substrate material, the substrate material is selected from a group consisting of SiC and AlN.

In another aspect, in the act of depositing the insulating layer, the insulating layer is a material select from a group consisting of a polycrystalline diamond film, and diamond-like carbon (DLC).

In yet another aspect, in the act of depositing a polycrystalline diamond film, the diamond film is deposited using a technique selected from a group consisting of chemical vapor deposition (CVD) and plasma enhanced chemical vapor deposition (PECVD).

Furthermore, in the act of depositing the polycrystalline diamond film, the diamond film is deposited at a substrate temperature between a range of approximately 900° C. and 1100° C.

Additionally, in the act of removing the handle wafer, the handle wafer is removed by immersing the composite wafer into a solution selected from a group consisting of Hydrofluoric Acid and Buffer Oxide Etch to selectively dissolve the $SiO_2$ bonding layer and separate the handle wafer.

In yet another aspect, in the act of removing the handle wafer, the handle wafer is removed by immersing the composite wafer into a wet etching solution, where the wet etching solution etches Si, but does not etch $SiO_2$, SiC, AlN and diamond, thereby etching out and removing the handle wafer.

Furthermore, in the act of removing the handle wafer, the handle wafer is removed by lapping and polishing the handle wafer to a thickness of 10 μm to 50 μm, with any remaining handle wafer being removed by a wet etching technique that selectively etches Si at a rate substantially greater than it does $SiO_2$ and diamond.

In another aspect, in the act of removing the handle wafer, the handle wafer is removed by lapping and polishing the handle wafer to a thickness of 10 μm to 50 μm. Any remaining handle wafer is removed by a dry etching technique that uses a solution selected from a group consisting of a chlorine-based plasma chemistry and a bromine-based plasma chemistry.

Furthermore, when the insulating layer is diamond-like carbon, the diamond-like carbon is deposited at a substrate temperature between a range of approximately 150° C. and 400° C.

Finally, it can be appreciated by one in the art that the present invention also comprises a product formed by the method described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
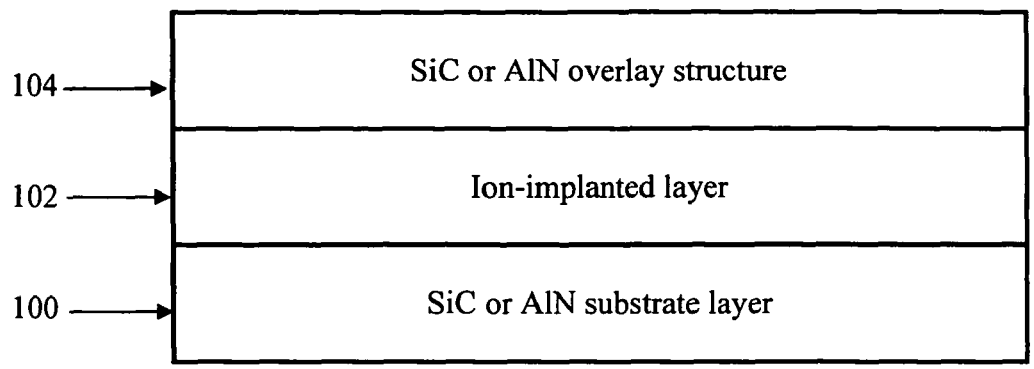
FIG. 1 is a cross-sectional view of an ion-implanted substrate wafer.

The present invention relates to a process used for fabricating SiC and AlN on diamond wafers. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

In order to provide a working frame of reference, first an introduction is provided to provide the reader with a brief understanding of the present invention. Finally, a description of various aspects of the present invention is provided to give an understanding of the specific details.

(1) Introduction

The present invention relates to a process used for fabricating SiC and AlN on diamond wafers, or on diamond-like carbon (DLC) wafers that can be used as substrates for deposition of GaN Heterojunction Field Effect Transistors (HFETs). According to the present invention, thin monocrystalline SiC or AlN films, which are epitaxially fused to polycrystalline diamond or DLC are used to provide seed for deposition of high quality epitaxial layers. The SiC-on-diamond substrates will enable fabrication of more powerful GaN HFETs, because they improve thermal management of the device. The composite SiC-on-diamond and AlN-on-diamond wafers fabricated by the method described herein would be a better substrate material for deposition of SiC Metal Oxide Semiconductor Field Effect Transistors (MOSFETs), GaN HFET, and Blue laser GaN epi-layers than conventional SiC wafers, because of improved thermal conductance.

(2) Description

The present invention is a process that is used to fabricate thin monocrystalline SiC and AlN films on top of large diameter polycrystalline diamond, or amorphous diamond-like carbon (DLC) wafers. Below, subsection (a) describes the process for fabricating SiC and AlN-on-diamond wafers, while subsection (b) describes the process for fabricating SiC and Al on DLC wafers.

(a) Fabricating Large Area SiC-on-Diamond and AlN-on-Diamond Wafers.

The process for fabrication of SiC-on-diamond and AlN-on-diamond wafers comprises the following operations:

i) Fabrication of SiC or AlN Overlay Layer by Blistering of H-Implanted SiC or AlN.

In 1995, an article published by M. Bruel in Electronics Letters, Vol. 31, pages 1201 through 1202, entitled, "Silicon on Insulator Material Technology," reported the Smart-Cut™ process. The Smart-Cut™ process is used to split a 50 nm to 200 nm thick Si layer from a full thickness Si wafer. The ion cut process is divided into several stages: 1) ion-implantation of hydrogen or He atoms into a Si wafer; 2) bonding of the implanted wafer to a handle wafer; and 3) splitting of the implanted wafer upon thermal annealing of the bonded par. In this section, a similar process is used to fabricate SiC-on-diamond and AlN-on-diamond films. The starting substrates for fabrication of SiC-on-diamond and AlN-on-diamond wafers are SiC and AlN, respectively. The starting substrates are implanted by an ion (i.e., hydrogen or helium) to a dose of approximately $2.5 \times 10^{16}$ cm$^2$ to $5 \times 10^{16}$ cm$^2$, which is typical for the Smart-Cut™ process. The implantation energy is chosen so that the ion-peak (e.g., H-peak) is located between approximately 300 nm to 500 nm below the wafer surface. FIG. 1 illustrates a cross section of an ion-implanted substrate wafer, showing three layers; the first layer being a Si or AlN substrate layer 100; the second layer being an ion-implanted layer 102; and the third layer being a SiC or AlN overlay layer 104 of approximately 300 nm to 500 nm thickness. Depending upon the initial substrate material, the composition of the layers includes either SiC or AlN. Additionally, the ion-implanted layer includes either Helium or Hydrogen, depending upon which ion was initially used to implant the starting substrate wafer.

Figure 2:
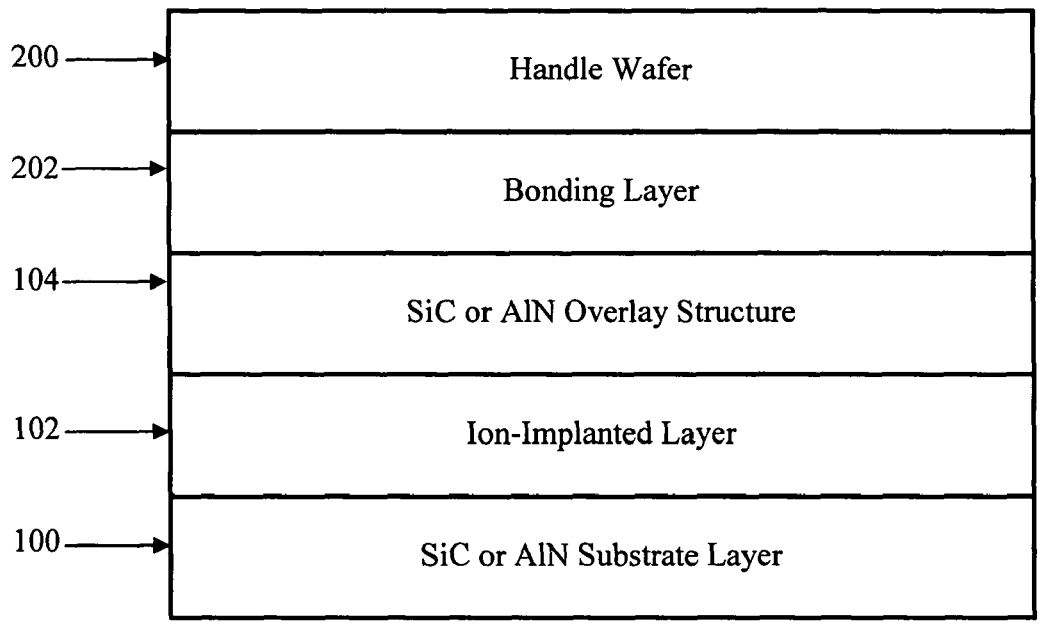
FIG. 2 is a cross-sectional view of an ion-implanted substrate wafer attached with a handle wafer through a $SiO_2$ bonding layer.
Figure 3:
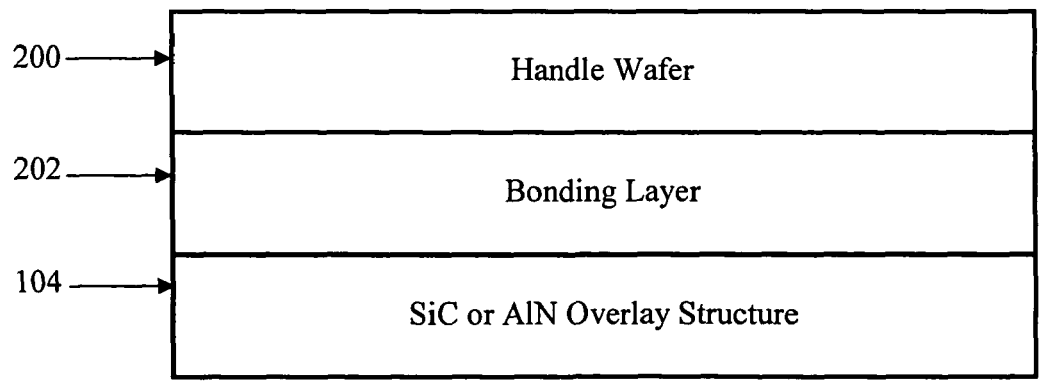
FIG. 3 is a cross-sectional view of the handle wafer attached with an overlay layer, with the substrate layer and ion-implanted wafer removed.

The overlay structure 104 is polished through Chemical Mechanical Polishing (CMP), and the ion-implanted substrate wafer is bonded to a Si handle wafer 200 with a bonding layer, such as a SiO$_2$ Bonding Oxide layer 202 (SiO$_2$ BOX layer), as shown in FIG. 2. The bonding process includes a room-temperature bonding step, and a first anneal at a temperature which is lower than 300° C. to strengthen the bonds at the interface of the overlay structure 104 and the SiO$_2$ bonding layer 202. A second anneal at a higher temperature is performed to split the ion-implanted substrate wafer across the ion-implanted region 102 (e.g., the H-implanted layer). As shown in FIG. 3, a thin mono-crystalline film of SiC or AlN 104 remains bonded to the handle wafer 200.

The third high temperature treatment at approximately 1000° C. is used to strengthen the bond between the SiC or AlN overlay structure 104 and the handle wafer 200. After splitting the overlay can be CMP polished to reduced surface roughness, although this operation might not be necessary.

ii) Depositing a Thermally Conductive Electrically Insulating Layer onto the SiC or the AlN Overlay.

Figure 4:
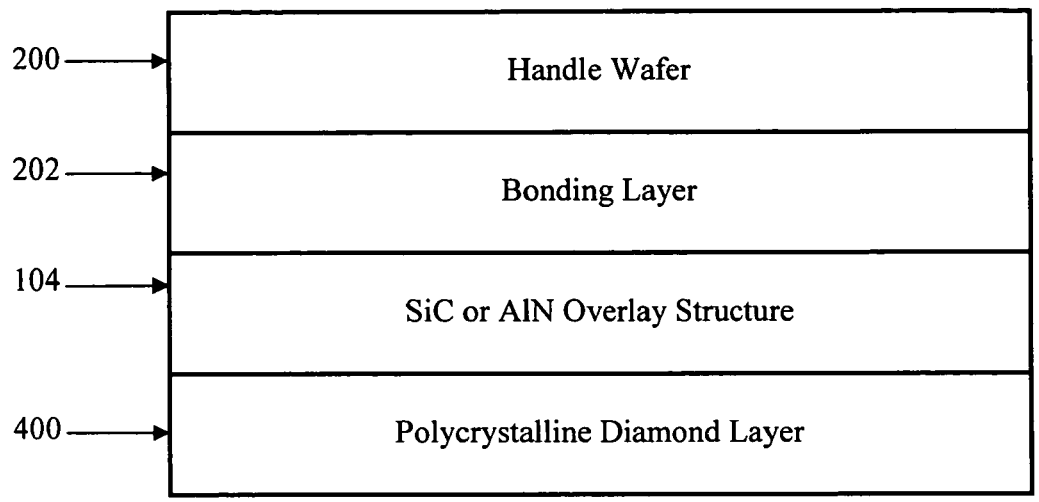
FIG. 4 is a cross-sectional view of a polycrystalline diamond layer attached with the overlay layer.

A thermally conductive electrically insulating layer, consisting of a polycrystalline diamond film, is deposited onto the SiC or AlN overlay by Chemical Vapor Deposition (CVD), or by Plasma Enhanced Chemical Vapor Deposition (PECVD). For The polycrystalline diamond film layer 400, shown in FIG. 4, is grown to a thickness of 200 μm to 500 μm. The reactors for deposition of CVD and PECVD diamond films are commercially available from several vendors. A typical growth rate for deposition of high quality diamond films is 3 μm per hour (thermal conductivity of 20 W/(cmK)). Higher deposition rates up to 6 μm per hour have been demonstrated, but at a cost of lower thermal conductivity (10 W/(cmK)) of resulting diamond layers. The CVD and PECVD diamond films are grown at the substrate temperature around 1000° C.

iii) Removal of the Si Handle Wafer.

The Si handle wafer 200 can be removed by many suitable techniques. Following are several exemplary handle wafer removal techniques:

Method 1: The composite wafer shown in FIG. 4, is immersed into a solution, such as Hydrofluoric Acid or Buffer Oxide Etch, to selectively dissolve the $SiO_2$ bonding layer 202 and separate the handle wafer 200 from the composite SiC 104 on diamond 400, or AlN 104 on diamond 400 wafer.

Method 2: The composite wafer shown in FIG. 4, is immersed into a wet etching solution. The wet etching solution etches Si, but does not etch $SiO_2$, SiC, AlN and diamond. As such, the Si handle wafer is etched out and removed from the remaining composite.

Method 3: The Si handle wafer is lapped and polished to a thickness of 10 μm to 50 μm. The remainder of the handle wafer is removed by any suitable wet etching technique that selectively etches Si, but does not attack $SiO_2$ or diamond, a non-limiting example of which includes tetramethylammonium hydroxide etch (TMAH). The TMAH solution etches Si at an etch rate of 1 μm per minute, while it etches $SiO_2$ at an etch rate of 1 nm per minute.

Method 4: The Si handle wafer is lapped and polished to a thickness of 10 μm to 50 μm. The remainder of the handle wafer is removed by dry etching in chlorine or bromine-based plasma chemistry. Chlorine and bromine-based plasma chemistries are preferred for this operation because they do not attack the underlying $SiO_2$ bonding layer.

iv) Polishing of Polycrystalline Diamond Film.

The thick polycrystalline diamond films 400 grown by CVD or PECVD have rough surfaces and have up to approximately a 10% variation in thickness uniformity. The polycrystalline diamond film 400 is mechanically polished to improve wafer flatness and to obtain the smooth and uniform surface finish required for wafer processing.

Please note that operation iv can be performed before operation iii.

v) Removal of the $SiO_2$ Binding Layer and CMP Polish the Si or AlN Overlay Structure.

Figure 5:
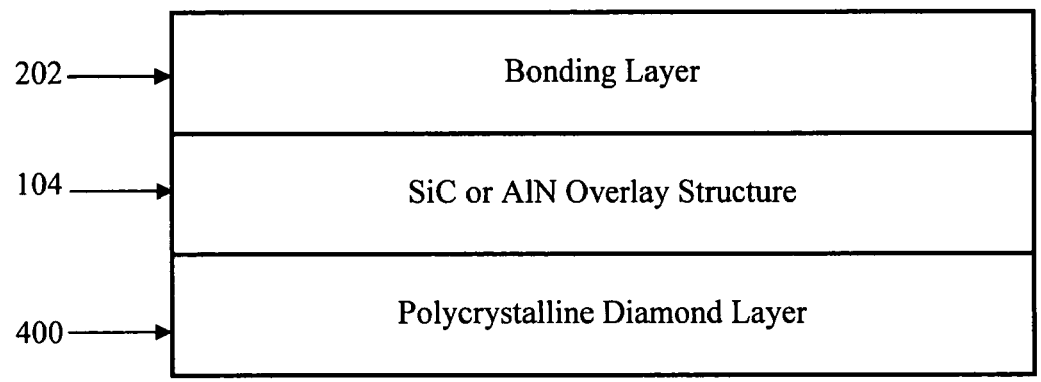
FIG. 5 is a cross-sectional view of the polycrystalline diamond layer attached with the overlay layer, with the handle layer removed.

As shown in FIG. 5, after the handle wafer has been removed, the remaining composite includes the $SiO_2$ binding layer 202, the SiC or AlN overlay layer 104, and the polycrystalline diamond layer 400. In final operations, the $SiO_2$ binding layer 202 is removed by wafer immersion into an acid solution, such as Hydrofluoric Acid, or by immersion into the Buffer Oxide Etch. After the $SiO_2$ binding layer 202 is removed, the SiC or AlN overlay layer 104 remains fused to the diamond layer 400. The remaining SiC or AlN overlay layer 104 is polished by Chemical Mechanical Polishing (CMP) to obtain surface finish that is required for nucleation of III-V nitride semiconductors. The SiC or AlN layer can then be thinned down by CMP to a thickness of 50 nm, thereby improving the thermal contact between the active area of the device and diamond. The CMP operation is the last operation in the process for fabricating SiC-on-diamond and AlN-on-diamond substrates.

Figure 6:
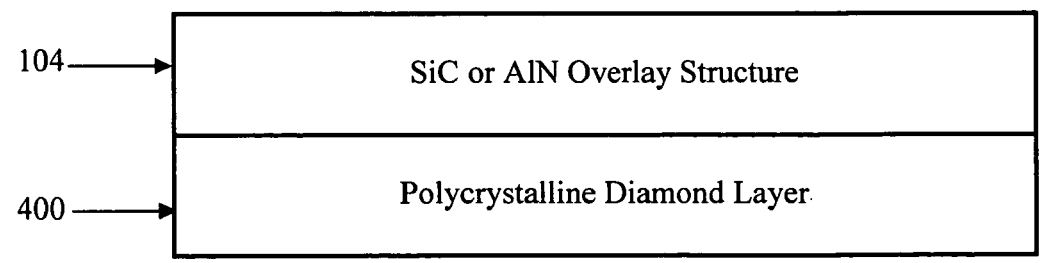
FIG. 6 is a cross-sectional view of the polycrystalline diamond layer attached with the overlay layer, with the $SiO_2$ bonding layer removed.

FIG. 6 illustrates a schematic cross section of SiC-on-diamond or AlN-on-diamond thermal management substrate. The finished thermal management substrate is an approximately 50 nm to 300 nm thick monocrystalline SiC or AlN film, epitaxially fused to an approximately 300 μm to 500 μm thick polycrystalline diamond substrate.

(b) Fabricating Large Area Si-on-Diamond-Like-Carbon (DLC) Wafers.

Diamond-like carbon (DLC) is an amorphous carbon material in which carbon atoms are bonded by a mixture of sp2 (graphite like) and sp3 (diamond-like) atomic bonds. DLC is a highly-insulating material with excellent thermal conductivity (10 W/(cmK)). DLC films can be deposited at a substrate temperature of 300° C. and at deposition rates of up to 20 μm/hour. The CVD reactors for deposition of DLC films are commercially produced by several vendors. The SiC or AlN-on-DLC wafers can be produced by the process as described in the previous section for fabrication of SiC or AlN-on-diamond wafers. The only difference between the two processes is in the CVD deposition of the insulating layer operation, where DLC films are deposited at lower temperatures in a different reactor.

What is claimed is:

1. A method for fabricating a thermal management substrate, the method comprising acts of:
    selecting a monocrystalline substrate material;
    ion-implanting the monocrystalline substrate material to form a ion-implanted substrate wafer, the ion-implanted substrate wafer having a monocrystalline substrate layer, an ion-implanted layer, and a monocrystalline overlay layer, the monocrystalline substrate layer being comprised of the monocrystalline substrate material;
    bonding a handle wafer to the overlay layer with a bonding layer;
    splitting the ion-implanted substrate wafer at the ion-implanted layer, resulting in a handle wafer bonded with the monocrystalline overlay layer;
    depositing a thermally conductive electrically insulating layer directly onto the monocrystalline overlay layer such that the overlay layer is epitaxially-fused with the insulating layer and such that the overlay layer is positioned in direct physical contact with the insulating layer, resulting in a composite structure, wherein the act of depositing is performed by a technique selected from a group consisting of plasma enhanced chemical vapor deposition (PECVD), sputtering, thermal evaporation, and chemical vapor deposition (CVD); and
    removing the handle wafer, resulting in a thermal management substrate that comprises a monocrystalline overlay layer epitaxially-fused with the thermally conductive electrically insulating layer, wherein the monocrystalline overlay layer is positioned in direct physical contact with the thermally conductive electrically insulating layer.

2. A method for fabricating a thermal management substrate as set forth in claim 1, further comprising an act of polishing the insulating layer to improve flatness and surface finish.

3. A method for fabricating a thermal management substrate as set forth in claim 2, further comprising an act of removing the bonding layer from the overlay layer.

4. A method for fabricating a thermal management substrate as set forth in claim 3, further comprising an act of polishing the overlay layer.

5. A method for fabricating a thermal management substrate as set forth in claim 4, wherein in the act bonding a handle wafer to the overlay layer with a bonding layer, the bonding layer is a $SiO_2$ Bonding Oxide layer 202 ($SiO_2$ BOX layer).

6. A method for fabricating a thermal management substrate as set forth in claim 5, wherein in the act of selecting the substrate material, the substrate material is selected from a group consisting of SiC and AlN.

7. A method for fabricating a thermal management substrate as set forth in claim 6, wherein in the act of depositing the insulating layer, the insulating layer is a material selected from a group consisting of a polycrystalline diamond film, and diamond-like carbon (DLC).

8. A method for fabricating a thermal management substrate as set forth in claim 7, wherein in the act of depositing a polycrystalline diamond film, the diamond film is deposited using a technique selected from a group consisting of chemical vapor deposition (CVD) and plasma enhanced chemical vapor deposition (PECVD).

9. A method for fabricating a thermal management substrate as forth in claim 7, wherein in the act of depositing the polycrystalline diamond film, the diamond film is deposited at a substrate temperature in a range of approximately 900° C. and 1100° C.

10. A method for fabricating a thermal management substrate as set forth in claim 9, wherein in the act of removing the handle wafer, the handle wafer is removed by immersing the composite wafer into a solution selected from a group consisting of Hydrofluoric Acid and Buffer Oxide Etch to selectively dissolve the $SiO_2$ bonding layer and separate the handle wafer.

11. A method for fabricating a thermal management substrate as set forth in claim 9, wherein in the act of removing the handle wafer, the handle wafer is removed by immersing the composite wafer into a wet etching solution, where the wet etching solution etches Si, but does not etch $SiO_2$, SiC, AlN and diamond, thereby etching out and removing the handle wafer.

12. A method for fabricating a thermal management substrate as set forth in claim 9, wherein in the act of removing the handle wafer, the handle wafer is removed by lapping and polishing the handle wafer to a thickness of 10 μM to 50 μm, with any remaining handle wafer being removed by a wet etching technique that selectively etches Si at a rate substantially greater than it does $SiO_2$ and diamond.

13. A method for fabricating a thermal management substrate as set forth in claim 9, wherein in the act of removing the handle wafer, the handle wafer is removed by lapping and polishing the handle wafer to a thickness of 10 μm to 50 μm, with any remaining handle wafer being removed by a dry etching technique that uses a solution selected from a group consisting of a chlorine-based plasma chemistry and a bromine-based plasma chemistry.

14. A method for fabricating a thermal management substrate as set forth in claim 7, wherein when the insulating layer is diamond-like carbon, the diamond-like carbon is deposited at a substrate temperature in a range of approximately 150° C. and 400° C.

15. A method for fabricating a thermal management substrate as set forth in claim 1, further comprising an act of removing the bonding layer from the overlay layer.

16. A method for fabricating a thermal management substrate as set forth in claim 1, further comprising an act of polishing the overlay layer.

17. A method for fabricating a thermal management substrate as set forth in claim 1, wherein in the act of selecting the substrate material, the substrate material is selected from a group consisting of SiC and AlN.

18. A method for fabricating a thermal management substrate as set forth in claim 1, wherein in the act of depositing the insulating layer, the insulating layer is a material selected from a group consisting of a polycrystalline diamond film, and diamond-like carbon (DLC).

19. A method for fabricating a thermal management substrate as set forth in claim 18, wherein when the insulating layer is a polycrystalline diamond film, the polycrystalline diamond film is deposited using a technique selected from a group consisting of chemical vapor deposition (CVD) and plasma enhanced chemical vapor deposition (PECVD).

20. A method for fabricating a thermal management substrate as set forth in claim 18, wherein when the insulating layer is a polycrystalline diamond film, the polycrystalline diamond film is deposited at a substrate temperature in a range of approximately 900° C. and 1100° C.

21. A method for fabricating a thermal management substrate as set forth in claim 1, wherein in the act of removing the handle wafer, the handle wafer is removed by immersing the composite wafer into a solution selected from a group consisting of Hydrofluoric Acid and Buffer Oxide Etch to selectively dissolve the bonding layer and separate the handle wafer.

22. A method for fabricating a thermal management substrate as set forth in claim 1, wherein in the act of removing the handle wafer, the handle wafer is removed by immersing the composite wafer into a wet etching solution, where the wet etching solution etches Si, but does not etch $SiO_2$, SiC, AlN and diamond, thereby etching out and removing the handle wafer.

23. A method for fabricating a thermal management substrate as set forth in claim 1, wherein in the act of removing the handle wafer, the handle wafer is removed by lapping and polishing the handle wafer to a thickness of 10 μm to 50 μm, with any remaining handle wafer being removed by a wet etching technique that selectively etches Si at a rate substantially greater than it does $SiO_2$ and diamond.

24. A method for fabricating a thermal management substrate as set forth in claim 1, wherein in the act of removing the handle wafer, the handle wafer is removed by lapping and polishing the handle wafer to a thickness of 10 μm to 50 μm, with any remaining handle wafer being removed by a dry etching technique that uses a solution selected from a group consisting of a chlorine-based plasma chemistry and a bromine-based plasma chemistry.

25. A method for fabricating a thermal management substrate as set forth in claim 18, wherein when the insulating layer is diamond-like carbon, the diamond-like carbon is deposited at a substrate temperature in a range of approximately 150° C. and 400° C.

26. A thermal management substrate formed by the method of claim 1.

27. A thermal management substrate formed by the method of claim 2.

28. A thermal management substrate formed by the method of claim 15.

29. A thermal management substrate formed by the method of claim 16.

30. A thermal management substrate formed by the method of claim 17.

31. A thermal management substrate formed by the method of claim 18.

32. A thermal management substrate formed by the method of claim 19.

33. A thermal management substrate formed by the method of claim 20.

34. A thermal management substrate formed by the method of claim 21.

35. A thermal management substrate formed by the method of claim 22.

36. A thermal management substrate formed by the method of claim 23.

37. A thermal management substrate formed by the method of claim 24.

38. A thermal management substrate formed by the method of claim 25.

\* \* \* \* \*